United States Patent [19]

Hisao

[11] Patent Number: 5,099,350

[45] Date of Patent: Mar. 24, 1992

[54] METHOD AND DEVICE FOR THE OPTICAL FILTERING AND PHOTODETECTION OF INTENSITY-MODULATED OPTICAL SIGNALS

[75] Inventor: Nakajima Hisao, Paris, France

[73] Assignee: Etat Francais represente par le Ministere des Postes, des Telecommunications et de l'Espace (Centre National d'Etudes des Telecommunications), Issy Les Moulineux, France

[21] Appl. No.: 388,155

[22] Filed: Aug. 1, 1989

[30] Foreign Application Priority Data

Aug. 11, 1988 [FR] France .................. 88 10825

[51] Int. Cl.[5] .................. H04B 10/04
[52] U.S. Cl. .................. 359/180
[58] Field of Search .......... 372/26, 31; 330/403; 455/619; 372/94, 96; 359/180

[56] References Cited

U.S. PATENT DOCUMENTS

| 3,875,400 | 4/1975 | Pao et al. | 455/619 |
| 4,903,341 | 2/1990 | Rice | 455/619 |
| 4,918,396 | 4/1990 | Halemane | 455/613 |

FOREIGN PATENT DOCUMENTS 0194530 8/1989 Japan .................. 455/619

OTHER PUBLICATIONS

Article by A. Alping et al., published in ELECTRONICS LETTERS, vol. 20, No. 19, 13.9.1984, pp. 794/795.
Article by H. Kawaguchi et al., published in APPLIED PHYSICS LETTERS, vol. 50 No. 2, 12.2.1987, pp. 66/67.
Article by G. Grobkoff et al., published in ELECTRONICS LETTERS, vol. 23, No. 25, 3.12.1987, pp. 1387/1388.
Abstract of Japanese patent 62-241 387 (NIPPON TELEGRAPH AND TELEPHONE CORP.).

Primary Examiner—Edward L. Coles, Sr.
Assistant Examiner—L. Pascal
Attorney, Agent, or Firm—Pearne, Gordon, McCoy & Granger

[57] ABSTRACT

Method and device for the optical filtering and photodetection of intensity-modulated optical signals.

Signals are injected into at least one resonating type semiconductor laser amplifier (2) close to the active layer (14) of this amplifier, the latter being polarized below its threshold current and having at least one resonance wavelength adjusted so as to coincide with the wavelength of at least one of the optical signals in order for this optical signal to be amplified by the amplifier, and the voltage existing between the terminals of the amplifier is detected so as to obtain, in the form of an electric signal, the information carried by the amplified optical signal when the angle between the polarization direction of the latter and the direction of the active layer is small.

Application for the embodiment of optical receivers.

13 Claims, 6 Drawing Sheets

METHOD AND DEVICE FOR THE OPTICAL FILTERING AND PHOTODETECTION OF INTENSITY-MODULATED OPTICAL SIGNALS

FIELD OF THE INVENTION

The present invention concerns a method and device for the optical filtering and photodetection of intensity-modulated optical signals. In particular, it applies to the embodiment of wavelength demultiplexers and optical receivers for grids with communication by optical fibers which are intensity modulated and wavelength multiplexed and whose respective wavelengths are extremely close to each other. It is also applicable in infrared spectroscopy to the embodiment of narrow window detectors.

BACKGROUND OF THE INVENTION

There are already known to exist various wavelength demultiplexing techniques, especially those techniques using thin layer filters, namely those which use directional waveguide couplers and those which use diffraction grids. However, the techniques mentioned above are unsuitable for the low cost demultiplexing of multiplexed wavelength optical signals whose respective wavelengths are very close to each other and, for example, are separated by merely a few tenths of one nanometer.

In effect, the thin layer filters and the directional waveguide couplers have wide optical passbands of, for example, about 70 nanometers and in addition are not wavelength-tuneable. The diffraction grids, which allowed for the above-envisaged demultiplexing (slightly spaced wavelengths), can theoretically be embodied, but would involve demultiplexers whose dimensions and cost is prohibitive, given the fact that a commerical diffraction grid demultiplexer already has a length of 8 cm for a wavelength selectivity of merely 0.163 nm (that is, it only makes it possible to separate two optical signals if the wavelengths of the latter are distant by more than 0.163 nm).

It is also possible to consider using for the envisaged demultiplexing a technique using periodical filters or even a technique using an independent heterodyne detection. However, such technques have the drawback of requiring—as have all the techniques also mentioned previously—the use of rapid photodetectors so as to convert the demultiplexed optical signals into electric signals.

Finally and in particular via the article by H. KAWAGUCHI et al published in Applied Physics Letters 50(2) Jan. 12th 1987, p. 66 and 67 and via the article by H. NAKAJIMA published in the reports of the ECOC 87 conference, p. 121 to 124 to which said articles refer, there is known to exist a technique suitable for the demultiplexing envisaged above and which to this effect uses a resonant type semiconductor laser amplifier (SLA). This amplifier may a Fabry-Perot or distributed feedback (DFB) type amplifier. Such devices are wavelength-tuneable optical filters which have a high optical gain and are thus able to be used both as amplifiers and optical filters.

However, a resonant type semiconductor laser amplifier also needs to be connected to a rapid photodetector so as to convert the optical signal it supplies into an electric signal.

SUMMARY OF THE INVENTION

The object of the present invention is to overcome this drawback.

It first of all concerns a method for the optical filtering and photodetection of optical signals which are linearly polarized and intensity-modulated with a view to have them carry information whereby the optical signals are injected into at least one resonant type semiconductor laser amplifier close to the active layer of this amplifier, the latter being polarized below its threshold current and having at least one resonance wavelength adjusted so as to coincide with the wavelength of at least one of the optical signals so that only this optical signal is amplified by the amplifier, and whereby the electric voltage existing between the terminals of the amplifier is detected so as to obtain in the form of an electric signal the information borne by the amplified optical signal when the angle between the polarization direction of this optical signal and the direction of the active layer is small.

The "Direction of the active layer" is understood to mean the direction defined by the section of this active layer observed on the side of the face of the amplifier on which the optical signals arrive.

These optical signals may be digital or analog. In addition, the intensity of the optical signals may be low, for example with the order of magnitude of the intensity of the luminous signals carried by the optical fibers, namely several microwatts or indeed less. However, when the signals are analog, their intensity ought to be low so as to prevent the amplifer from being saturated.

By means of the present invention, an electric signal is thus directly obtained from the amplifier used, which is used both as an optical pass-band filter and a wavelength tuneable rapid photodetector.

This photodetector-filter is sensitive to polarization of the incident optical signals: the information carried by the amplified optical signal is much better translated into an electric form when the angle between the polarization direction of this optical signal and the direction of the active layer is small, the effect being optimal when this angle is nil and stopping when this angle is equal to 90 degrees.

The present invention may make it possible to obtain a wavelength selectivity of about 0.04 nm, an electric pass-band of more than 400 MHz, indeed several GHz, and a photodetection responsivity of about 1000 V/M (20A/W), namely a responsivity clearly greater than that of a germanium avalanche photodetector. Moreover, the invention may also be implemented by means of a small device, for example a device whose width, height and length are respectively 0.4, 0.1 and 0.25 mm.

The resonance wavelength may be adjusted by adjusting the temperature of the amplifier and/or the intensity of the polarization current of this amplifier. The present invention may also make it possible to obtain for the resonance wavelength a variation of about 0.14 nm for a variation of 1 Kelvin of the temperarture of the amplifier and a variation of about 0.09 nm for a variation of 1 mA of the polarization current of the amplifier.

This amplifier may be of the Fabry-Pérot type, but preferably is of the distributed resonator type. In fact, a distributed resonator type has only a single resonance wavelength and owing to this is able to be tuned over a wavelength range much more extensive than the Fabry-Pérot type amplifier; moreover, it possesses greater wavelength selectivity than the latter and is entirely suitable for constituting a wavelength narrow window optical filter.

The present invention also seeks to provide a device for the filtering and photodetection of optical signals which are polarized linearly and intensity-modulated with a view to having them carry information, said device comprising:

at least one resonant type semiconductor laser amplifier having at least one resonance wavelength, the optical signals being intended to be injected into this amplifier close to the active layer of the latter, means to polarize the amplifier below its threshold current, means to adjust the resonance wavelength of the amplifier so that it coincides with the wavelength of at least one of the optical signals with the result that only this optical signal is amplified by the amplifier, and means to detect the electric voltage existing between the terminals of the amplifier so as to obtain in the form of an electric signal the information borne by the amplified opttical signal when the angle between the polarization direction of this optical signal and the direction of the active layer is small.

According to one particular embodiment of the device of the invention, said resonant type semiconductor laser amplifier is single and intended to receive a plurality of intensity-modulated and linearly polarized optical signals whose respective wavelengths differ from each other and whose polarization directions are merged so as to have the resonance wavelength of the amplifier coincide with the wavelength of one of the signals.

In this case, the respective polarization directions of the optical signals are preferably parallel to the direction of the active layer of the amplifier.

According to a further particular embodiment, the device of the invention includes N resonant type semiconductor laser amplifiers, each intended to receive N linearly polarized and intensity-modulated optical signals whose respective wavelengths differ from each other, N being a whole number at least equal to 2, so as to have the resonance wavelengths of the N amplifiers to respectively coincide with the N wavelengths of the optical signals.

In this case, the respective active layers of the N amplifiers may be parallel, the respective polarization directions of the N optical signals then being parallel to each other, the directions of the respective active layers of the N amplifiers being parallel to these polarization directions.

According to a further particular embodiment, the device of the invention includes two resonant type semiconductor laser amplifiers whose active layers are perpendicular and are each intended to receive two linearly polarized and intensity-modulated optical signals with the same wavelength, the respective polarization directions of these signals being perpendicular and one of them being parallel to the active layer of one of the amplifiers, so as to have the two optical signals respectively detected by the two amplifiers when the resonance wavelength of each of the latter coincides with said same wavelength.

The two optical signals may be independent or may even be digital or analog and complement each other, the device then also comprising subtracter means provided to output supply an electric signal equal to the difference between the electric signals respectively supplied by the amplifiers.

Finally, according to a further particular embodiment, the device of the invention includes:

two resonant type semiconductor laser amplifiers whose active layers are perpendicular and are intended to each receive the same optical signal, said optical signal having a given wavelength and being linearly polarized and intensity-modulated, the polarization direction of this signal being parallel to the direction of the active layer of one of the amplifiers, and adding means provided for adding the electric signals respectively supplied by the two amplifiers when the resonance wavelength of each of the latter coincides with the given wavelength so as to obtain, in the form of an electric signal at the output of the adding means, the information carried by said same optical signal.

BRIEF DESCRIPTION OF THE DRAWINGS

The present invention shall be more readily understood from a reading of the following description of embodiment examples, given purely by way of information and being in no way restrictive, accompanied by the attached drawings in which.

DETAILED DESCRIPTION OF THE PREFERRED EMBODIMENTS

Figure 1:
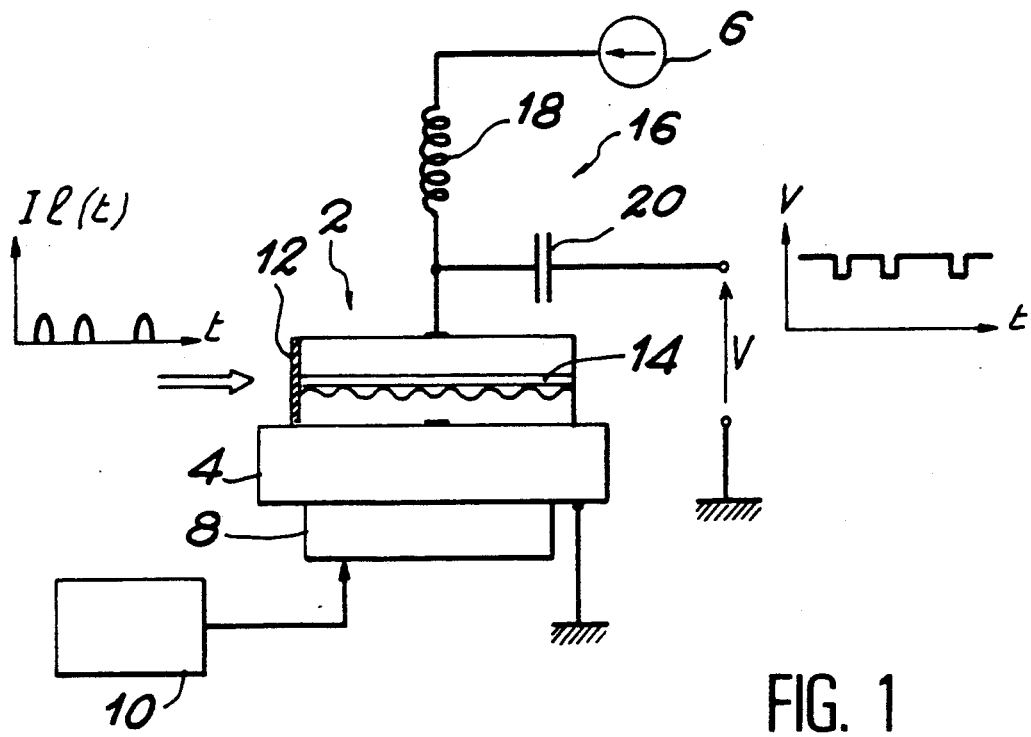
FIGS. 1 and 1A diagrammatically illustrate the principle of the invention.

FIG. 1 diagrammatically illustrates the principle of the present invention. A resonant type semiconductor laser amplifier is used in the invention. For example, this amplifier is a distributed feedback type amplifier, still called a distributed feedback laser diode. One terminal of this laser diode 2 is grounded by means of the fixed connector 4, possibly made of copper, on which the diode is found. This diode is polarized as far as below its threshold current by means of a source 6 with a constant electric current Ib connected to the other terminal of the diode. Thus, the laser diode 2, which possesses a single resonance wavelength $l_o$, functions as a resonating amplifier. The wavelength $l_o$ may be adjusted by modifying the polarization current Ib of the amplifier (by adjusting the source 6) or by modifying the temperature of this amplifier by means of a thermoelectric element, for example a Peltier element 8, which is in thermal contact with the fixed connector 4. Furthermore, it is possible to keep this temperature roughly constant via an automatic control circuit 10 which controls the element 8 and which comprises a temperature sensor (not represented), for example a thermistor, in thermal contact with the fixed connector 4.

The adjustment of $l_o$ may also be effected by acting on both the temperature of the laser diode and on the polarization current of the latter.

Onto one face of the laser diode 2 or input face, preferably provided with a coating 12, optical signals are sent with a wavelength l whose intensity I1 (t) is modulated (that is, varies time-controlled in a specific way). More specifically, these optical signals are sent perpendicular to the input face and so as to fall close to the active layer 14 of the laser diode 2. Moreover, these optical signals are in the form of a light which is linearly polarized and whose polarization direction is parallel to the direction of the active layer 14.

By selecting the laser diode 2 so that the range in which lo may be made to vary contains the length l of the signals, it is thus possible to adjust lo so that it coincides with l.

When the light is present at the input of the laser diode, it is then observed that the voltage V between the terminals of the laser diode reduces with respect to the value of V when the light is absent. This reduction is proportional to the intensity of the light for weak luminous intensities. The effect observed only occurs when l is roughly equal to lo.

By detecting this voltage variation over a period of time, it is thus possible to acquire, in the form of electric signals, the information sent onto the laser diode 2 in the form of intensity-modulated optical signals.

Moreover, it can be observed that the voltage reduction is that much greater when the polarization current Ib is near the threshold current of the laser diode.

It is also established that the effect observed diminishes when the polarization direction of the light deviates from the plane of the active layer, this effect being sensitive to the polarization of the optical signals.

The constant current feeding and the detection of the voltage V may be effected by means of a T polarization 16 traditionally comprising an inductive resistor 18 and a capacitor 20 having a common terminal connected to said other terminal of the laser diode 2, the other terminal of the inductive resistor 18 being connected to the source 6 and the other terminal of the capacitor 20 enabling the signal with voltage V to be received. This signal is then exploited by conventional means.

Figure 1A:
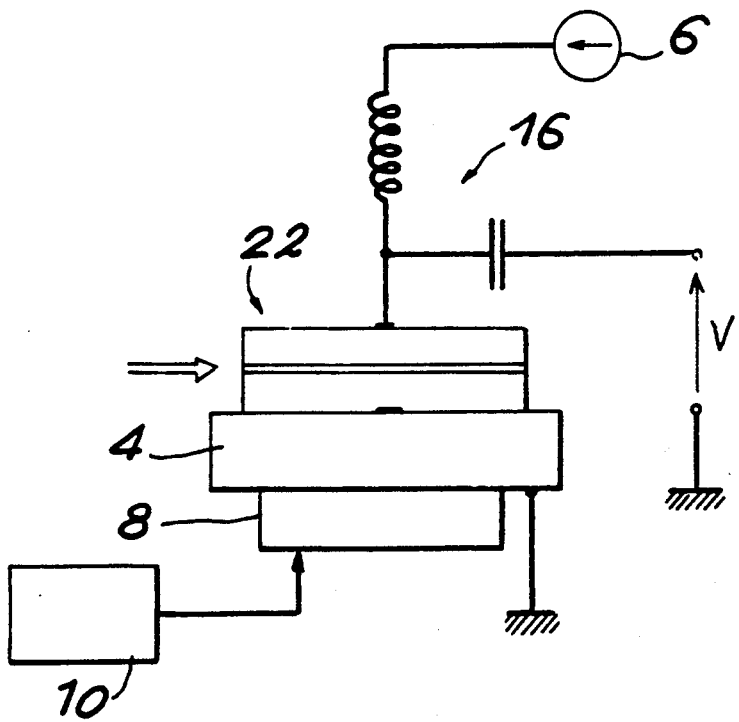

FIG. 1A diagrammatically illustrates the fact that the distributed feedback laser diode 2 may be replaced by a Fabry-Pérot resonating type semiconductor laser amplifier (which does not comprise a coating). Then this amplifier is selected so that the range in which one of its resonance wavelengths lr may be varied contains l, and lr is adjusted so that it coincides with l.

Figure 2:
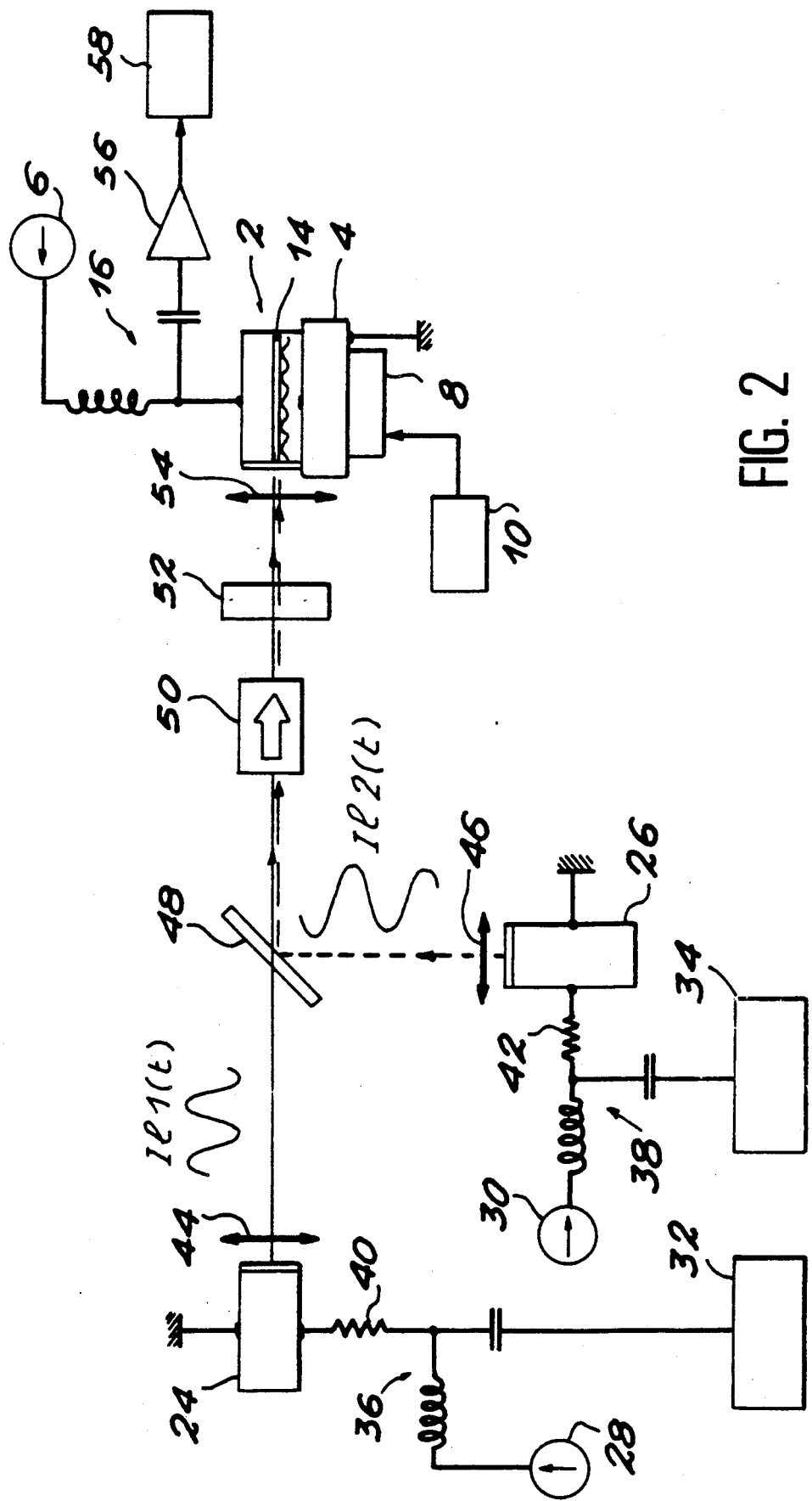
FIG. 2 is a diagrammatic view of a device according to the invention and forming an optical receiver.

FIG. 2 diagrammatically illustrates one application of the invention for the embodiment of an optical receiver. This receiver uses the possibility of syntonizing the wavelength of the optical filter, constituted by a suitably polarized distributed feedback laser diode, as well as the wide electric pass-band of this diode. This receiver thus makes it possible to select a transmission channel from a plurality of high flow channels. Each channel is allocated its own optical wavelength and the wavelengths of the channels may be distributed within a range of wavelengths of about 3 nanometers with a spacing between two adjacent wavelengths of possibly about several tenths of one nanometer, which makes it possible to have at least 10 channels or possibly more. The example of FIG. 2 is limited to 2 channels.

The receiver diagrammatically represented on FIG. 2 thus makes it possible to select one channel from two channels whose respective wavelengths are marked l1 and l2 and are extremely close to each other.

Optical signals with a wavelength l1 (respectively l2), linearly polarized and whose intensity marked Il1(t) (respectively Il2(t)) is modulated, are emitted by a distributed feedback laser diode 24 (respectively 26) whose polarization current is slightly modulated. FIG. 2 shows a constant current generator 28 (respectively 30) and an oscillator 32 (respectively 34) which enable this polarization current of the laser diode 24 (respectively 26) to be modulated by means of a T polarization 36 (respectively 38), this T polarization being connected to the diode 24 (respectively 26) by a resistor 40 (respectively 42) enabling the impedance to be adapted.

The light emitted by the diode 24 (respectively 26) is transformed into a parallel beam by means of a suitable optical device 44 (respectively 46). The two beams obtained are sent onto an output semi-transparent plate 48 from which a single beam is obtained in which mixed are the two optical signals with the wavelengths l1 and l2. The diodes 24 and 26 are disposed so that in this single beam the polarization directions of the optical signals are merged. This single beam is successively sent onto the input face of the distributed feedback laser diode 2 by means of a Faraday optical isolator 50 provided to avoid the "back-couplings" of the diode 2 towards the diodes 24 and 26, a half-wave plate 52 and a microscope lens 54. The half-wave plate 52 is provided to bring back the polarization direction common to the two signals to the state it had before traversing the isolator 50. The fact that l1 and l2 are very close to each other effectively enables a single half-wave to be used. The laser diode 2 is disposed so that its active layer is parallel to the polarization direction common to the optical signals and so that the single beam arrives close to the active layer of this diode. In addition, this diode is polarized below its threshold current.

By way of information and in no way restrictive, the laser diode 2 has the following characteristics: grid pitch=0.46 micrometers, grid sequence=2, coupling coefficient=about 50 cm$^{-1}$, threshold current at 20° C.=42.3 mA.

The temperature of the laser diode 2 is stabilized, for example, at about 20° C., by means of the Peltier element connected to the automatic control circuit 10. It is also possible to similarly temperature-stabilize the laser diodes 24 and 26. The signal corresponding to the voltage V between the terminals of the laser diode 2 is recovered by means of the T polarization 16 and, after having been amplified by an amplifier 56, is sent to a high-frequency spectrum analyzer 58. The amplifier 56 is a wide band amplifier (0.01 GHz–2 GHz) with a gain of 32 dB, for example.

The laser diodes 24 and 26 are, for example, adjusted so that l2-l1 is equal to 0.13 nanometers (l1 = 1505 nm and l2 = 1505.13 nm) and the modulation frequency relating to l1 (respectively l2) is, for example, equal to 280 MHz (respectively 347 MHz).

Figure 3A:
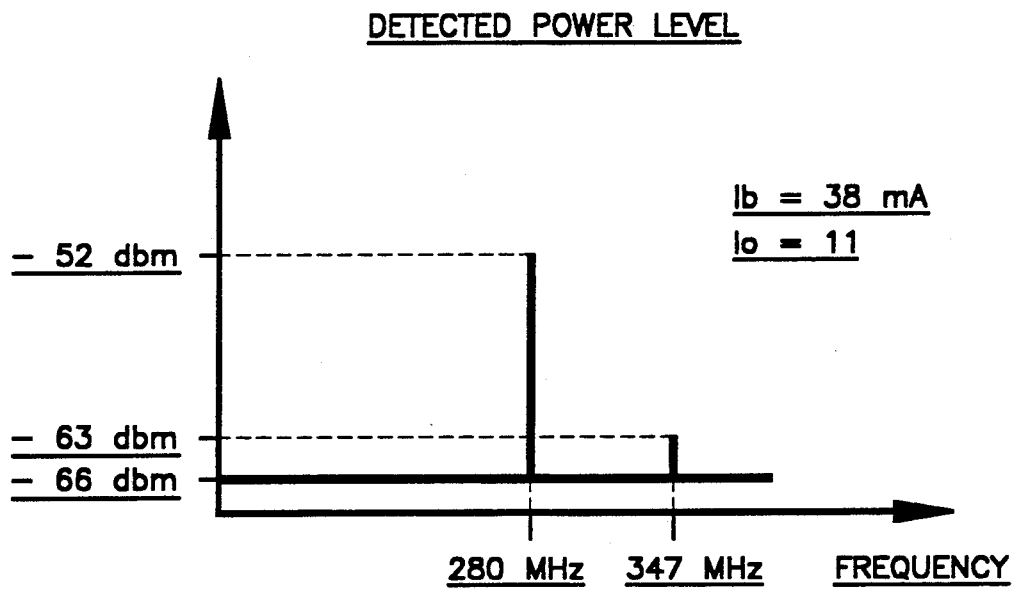
FIGS. 3A and 3B are graphs showing the power levels detected with this receiver, respectively for two optical signals with different wavelengths.

With the mixed optical signals falling onto the laser diode 2 close to the active layer of the latter, the polarization current of this laser diode 2 is adjusted to 38 mA so as to syntonize its resonance wavelength lo to that of the laser diode 24 (l1). The 280 MHz signals derived from the laser diode 24 are then clearly observed on the spectrum analyzer. A diaphony of −11 dB from the channel 2 (relating to the laser diode 26) to the channel 1 (corresponding to the laser diode 24) is observed (see FIG. 3A).

Figure 3B:
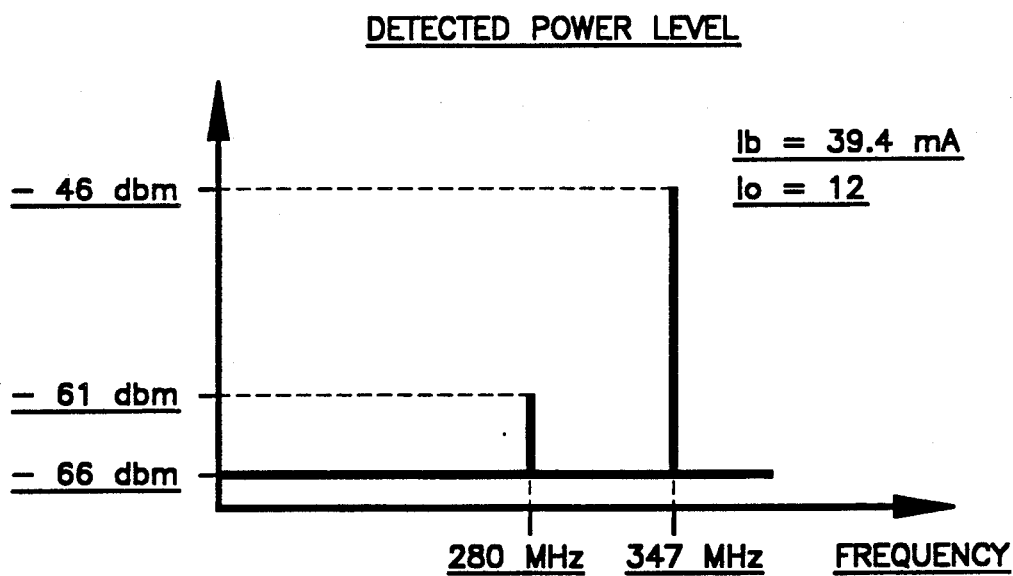

By then adjusting the polarization current of the laser diode 2 to 39.4 mA, the resonance wavelength of this laser diode 2 is syntonized to that of the laser diode 26 (12). The 347 MHz signals corresponding to the laser diode 26 are then observed on the analyzer 58. A diaphony of −15 dB from the channel 1 to the channel 2 is then observed (see FIG. 3B).

Figure 4:
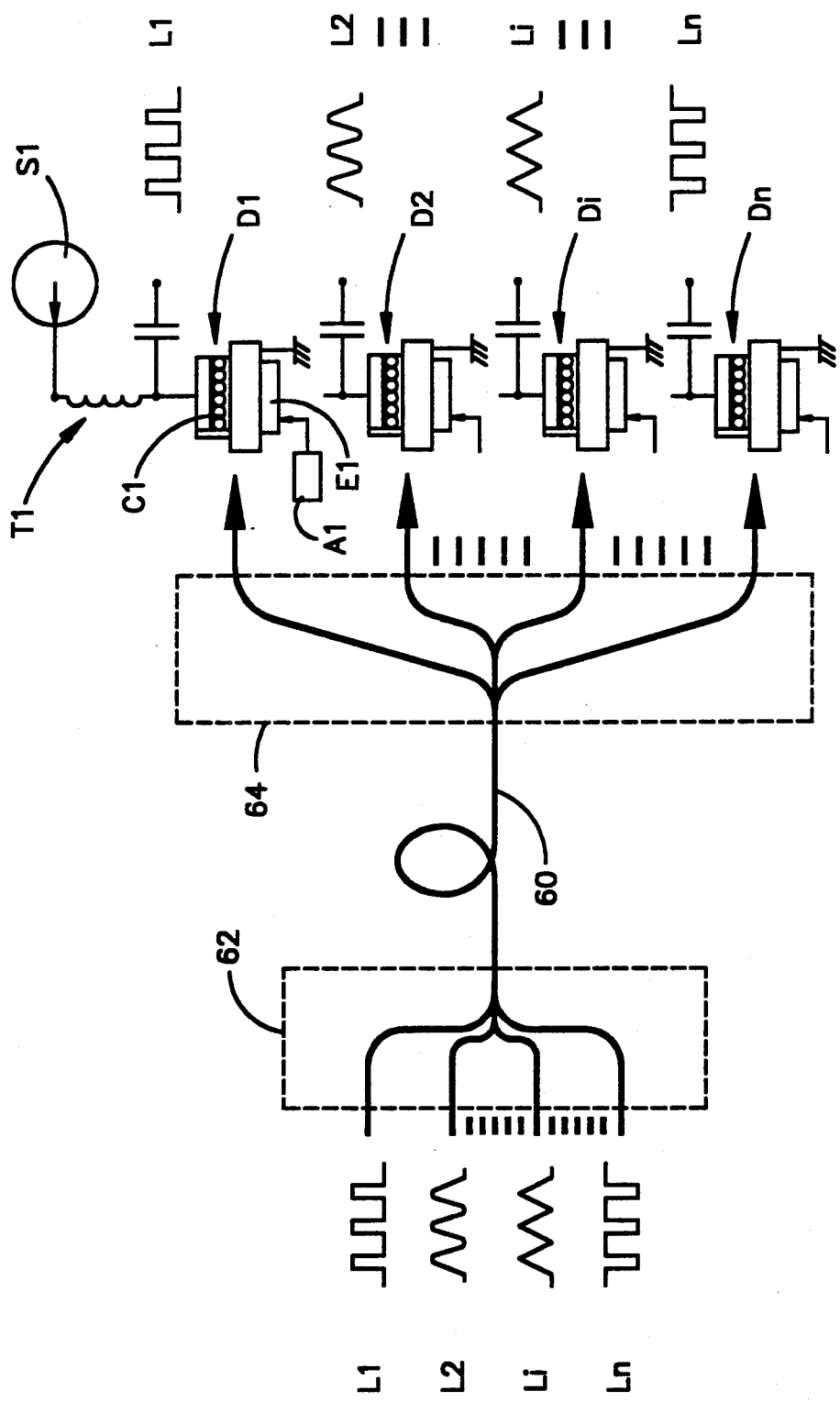
FIG. 4 is a diagrammatic view of a device according to the invention and forming a demultiplexer with N channels.

FIG. 4 diagrammatically illustrates one application of the invention for the embodiment of a wavelength demultiplexer with N channels respectively corresponding to optical signals with different wavelengths L1, L2, ... Li, ... LN. These intensity-modulated optical signals are linearly polarized and have parallel polarization directions, are injected into a monomode optical fiber 60 by means of an "N towards 1" optical coupler 62. The demultiplexer includes N distributed resonator laser diodes D1, D2, ... Di, ... DN. The wavelength multiplexed optical signals borne by the fiber 60 are distributed by means of a "1 towards N" coupler 64 to each of the N laser diodes D1, ... DN and injected close to the respective active layers (such as C1) of these diodes. These active layers are parallel and the polarization directions of the optical signals are parallel to these layers. If required, it is possible to insert between each branch of the coupler 64 and the corresponding laser diode a device making it possible to bring polarization of the optical signals back to its initial state, that is to the state it had before entry into the coupler 62. All the laser diodes are polarized below their threshold current so that they function as amplifiers and the N resonance wavelengths of the N laser diodes are respectively syntonized on the N wavelengths of the optical signals by appropriately acting on the polarization current and/or the temperature of each of the laser diodes. Each laser diode, such as D1, is connected via a T polarization, such as T1, to a constant current source, such as S1. In order to adjust the polarization of each laser diode, such as D1, and adjustment is thus made of the corresponding constant current source and/or the temoperature of this laser provided for this effect with a Peltier element E1 connected to an automatic control circuit A1.

Then by means of the polarization Ts, N electric signals are respectively extracted respectively corresponding to the N optical signals.

A demultiplexer is obtained which presents good wavelength selectivity and good photodetection responsivity and whose amplifiers/diodes/lasers have a wide electric pass-band.

Figure 5:
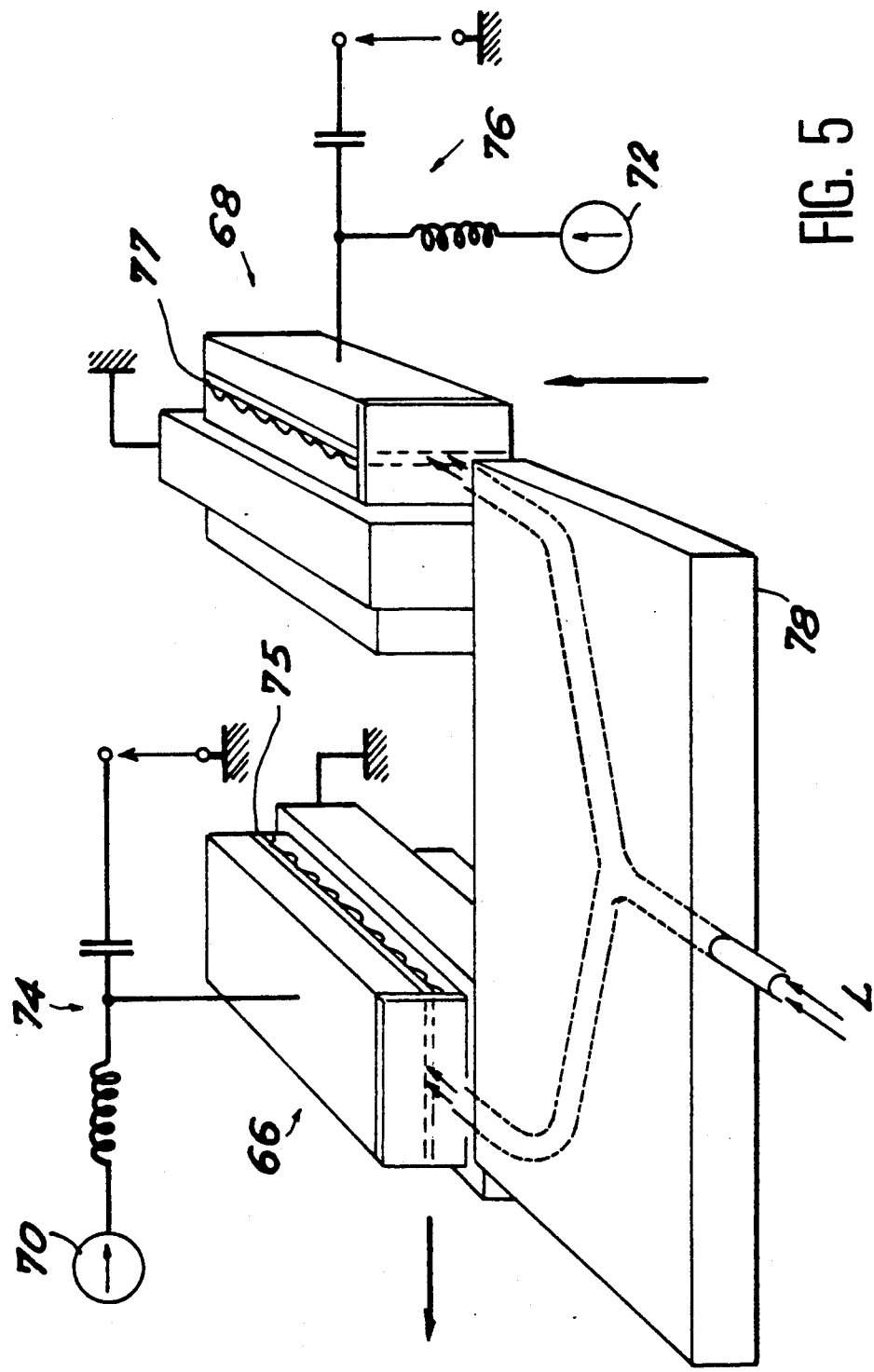
FIG. 5 is a diagrammatic view of a device according to the invention and forming an optical signal receiver whose respective polarization directions are perpendicular.

FIG. 5 diagrammatically illustrates one application of the present invention for the embodiment of an optical signal receiver. This receiver includes two distributed feedback laser diodes 66 and 68. The diode 66 (respectively 68) is polarized below its threshold current with the aid of a constant current source 70 (respectively 72) by means of a T polarization 74 (respectively 76). The receiver uses the good optical polarization responsivity and the wide electric pass-band of the laser diodes functioning as amplifiers which it comprises. These laser diodes 66 and 68 are disposed so that their respective active layers 75 and 77 are perpendicular to each other.

In addition, the respective resonance wavelengths of these laser diodes are adjusted so as to equal a given value L, the wavelength common to two optical signals which are both linearly polarized and whose respective polarization directions are perpendicular to each other. These two optical signals are mixed within a given luminous beam and sent via a Y coupler 78 onto the input face (preferably provided with a coating) and close to the active layer from each of the laser diodes 66 and 68. The coupler 78 thus has two branches respectively opposite the laser diodes 66 and 68. Each diode is orientated with respect to the corresponding branch of the coupler so that its active layer is parallel to one of the respective polarization directions of the signals with the result that the two diodes 66 and 68 respectively select the two signals.

In order to illustrate this, it is supposed that one of the signals has a horizontal polarization and the other has a vertical polarization and the active layer of the diode 66 is horizontal, this diode 66 thus selecting the horizontal polarization signal, whereas the active layer of the diode 68 is vertical, this diode 68 thus selecting the vertical polarization signal.

Then, via the T polarization 74 (respectively 76), the electric signal is extracted corresponding to the optical signal selected by the laser diode 66 (respectively 68).

Thus, it can be seen that the receiver represented on FIG. 5 makes it possible to double the number of transmission channels. Furthermore, no photodetector is required (other than the diodes 66 and 68).

Figure 6:
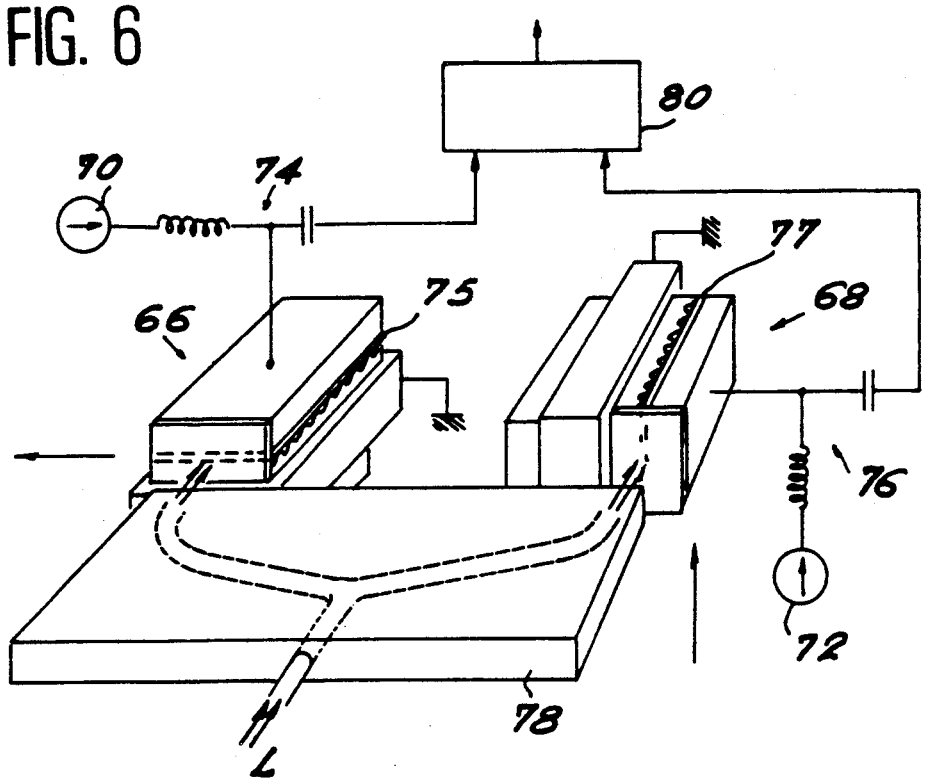
FIGS. 6 and 7 are diagrammatic views according to the invention and forming optical signal receivers.

FIG. 6 diagrammatically represents another receiver which differs from the one shown on FIG. 5 by the fact that it further includes subtracting means 80 whose two inputs respectively receive the two electric signals supplied by the diodes 66 and 68 by means of the polarization Ts 74 and 76 and which output supply an electric signal equal to the difference between these two electric signals. Moreover, the optical signals with the same wavelength L are no longer in this instance independent, as they were in the case of FIG. 5: these are digital signals complementary to each other, that is that when one of these signals is at the logic state 1, the other is at the logic state 0 and vice versa, these signals thus bearing the same information.

Thus, it can be seen that this information is obtained at the output of the means 80 with a good signal/noise ratio, even when one rotation of the polarization direction occurs prior to the arrival of the optical signals at the laser diodes 66 and 68.

Figure 7:
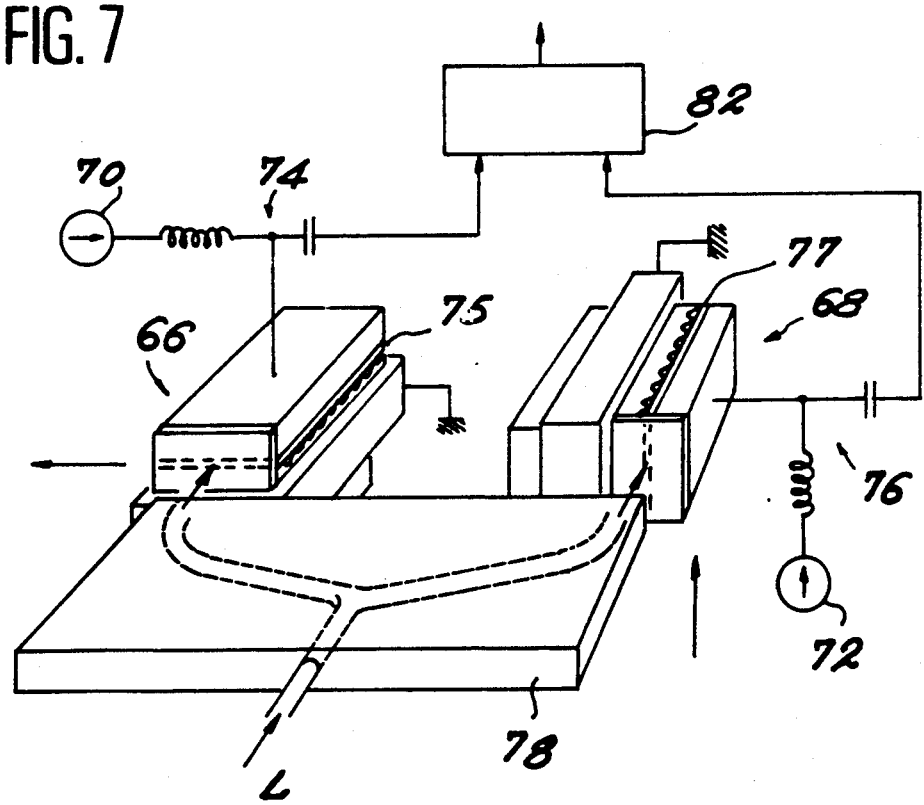

FIG. 7 diagrammatically shows another receiver which differs from the one represented on FIG. 5 by the fact that it further includes adding means 82 whose two inputs respectively receive the two electric signals supplied by the diodes 66 and 68 by means of the polarization Ts 74 and 76 and which output supply an electric signal equal to the sum of these two electric signals. Moreover, a single optical signal with a wavelength L (instead of two signals) is sent to the input of the coupler 78. The respective active layers of the diodes 66 and 68 are still perpendicular to each other and the incident optical signal has a rectilinear polarization and a polarization direction parallel to the direction of the active layer of one of the diodes 66 and 68.

Thus, at the output of the means 82, it can be seen that it is possible to obtain the information borne by the optical signal with a good sound/noise ratio, even when this optical signal undergoes one rotation of its polarization direction before it arrives at the laser diodes 66 and 68.

What is claimed is:

1. A method for the optical filtering and photodetection of optical signals which are linearly polarized and intensity-modulated in order to have them carry information, whereby optical signals are injected into at least one resonant type semiconductor laser amplifier close to the active layer of this amplifier, said amplifier being biased below its threshold current and having at least one resonance wavelength adjusted so as to coincide with the wavelength of at least one of the optical signals so that only this optical signal is amplified by the amplifier and whereby the electric voltage existing between the terminals of the amplifier is detected so as to obtain, in the form of an electric signal, the information carried by the amplified optical signal when the angle between the polarization direction of this optical signal and the direction of the active layer is small.

2. A method according to claim 1, wherein the resonance wavelength is adjusted by adjusting the temperature of the amplifier and/or the intensity of the biasing current of this amplifier.

3. A method according to claim 1, wherein the amplifier is a Fabry-Pérot type amplifier.

4. A method according to claim 1, wherein the amplifier is a distributed feedback type amplifier.

5. A device for the optical filtering and photodetection of optical signals which are linearly polarized and intensity-modulated in order to have them carry information, said device comprising:
   at least one resonant type semiconductor laser amplifier having at least one resonance wavelength, the optical signals being intended to be injected into this amplifier close to the active layer of said amplifier,
   means to bias the amplifier below its threshold current,
   means to adjust the resonance wavelength of the amplifier so that it coincides with the wavelength of at least one of the optical signals so that only this optical signal is amplified by the amplifier, and
   means to detect the electric voltage existing between the terminals of the amplifier so as to obtain, in the form of an electric signal, the information carried by the amplified optical signal when the angle between the polarization direction of this optical signal and the direction of the active layer is small.

6. A device according to claim 5, wherein said resonant type semiconductor laser amplifier is single and intended to receive a plurality of intensity-modulated and linearly polarized optical signals whose respective wavelengths are different from each other and whose polarization directions are merged so as to have the resonance wavelength of the amplifier coincide with the wavelength of one of the signals.

7. A device according to claim 6, wherein the respective polarization directions of the optical signals are parallel to the direction of the active layer of the amplifier.

8. A device according to claim 5, comprising N resonant type semiconductor laser amplifiers, each intended to receive N linearly polarized and intensity-modulated optical signals whose respective wavelengths are different from each other, N being a whole number at least equal to 2 so as to have the resonance wavelengths of N amplifiers respectively coincide with the N wavelengths of the optical signals.

9. A device according to claim 8, wherein the respective active layers of the N amplifiers are parallel and the respective polarization directions of the N optical signals are parallel to each other, the directions of the respective active layers of the N amplifiers being parallel to these polarization directions.

10. A device according to claim 5, comprising two resonant type semiconductor laser amplifiers whose active layers are perpendicular and which are intended to each receive two linearly polarized and intensity-modulated optical signals of the same wavelength, the respective polarization directions of these signals being perpendicular with one of them being parallel to the active layer of one of the amplifiers so as to respectively detect the two optical signals by the two amplifiers when the resonance wavelength of each of said amplifiers coincide with said same wavelength.

11. A device according to claim 10, wherein the two optical signals are independent.

12. A device according to claim 10, wherein the two optical signals are digital and complementary to each other, the device further comprising subtracting means provided so as to output supply an electric signal equal to the difference between the electric signals respectively supplied by the amplifiers.

13. A device according to claim 5, comprising:
   two resonant type semiconductor laser amplifiers whose active layers are perpendicular and which are intended to each receive the same optical signal, this optical signal having a given wavelength and being linearly polarized and intensity-modulated, the polarization direction of this signal being parallel to the direction of the active layer of one of the amplifiers, and
   adding means provided to add up the electric signals respectively supplied by the two amplifiers when the resonance wavelength of each of the latter coincides with the given wavelength so as to obtain, in the form of an electric signal, the information carried by said optical signal at the output of the adding means.

* * * * *